(12) United States Patent
Jung et al.

(10) Patent No.: US 7,106,117 B2
(45) Date of Patent: Sep. 12, 2006

(54) DELAYED CLOCK SIGNAL GENERATOR

(75) Inventors: Gun-Ok Jung, Suwon-si (KR); Jin-Han Kim, Seoul (KR); Sung-Bae Park, Sungnam-si (KR); Chul-Woo Kim, Seoul (KR); Seok-Soo Yoon, Changwon-si (KR); Seok-Ryoung Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 39 days.

(21) Appl. No.: 10/910,644

(22) Filed: Aug. 4, 2004

(65) Prior Publication Data

US 2005/0052211 A1    Mar. 10, 2005

(30) Foreign Application Priority Data

Aug. 4, 2003    (KR) .............. 10-2003-0053859

(51) Int. Cl.
*H03H 11/26* (2006.01)
(52) U.S. Cl. .............................. 327/277; 327/284
(58) Field of Classification Search .............. None
See application file for complete search history.

(56) References Cited

U.S. PATENT DOCUMENTS

| 6,122,336 | A  | * | 9/2000 | Anderson ............... 375/371 |
| 6,133,773 | A  | * | 10/2000 | Garlepp et al. .......... 327/247 |
| 6,501,312 | B1 |   | 12/2002 | Nguyen ................... 327/161 |
| 6,650,160 | B1 | * | 11/2003 | Tanahashi ................ 327/277 |
| 2003/0002607 | A1 | * | 1/2003 | Mooney et al. ........... 375/355 |
| 2003/0006817 | A1 | * | 1/2003 | Seo et al. ............... 327/276 |
| 2003/0043926 | A1 | * | 3/2003 | Terashima et al. ........ 375/257 |
| 2003/0155953 | A1 | * | 8/2003 | Hirata et al. ........... 327/236 |
| 2004/0252804 | A1 | * | 12/2004 | Aoyama .................. 375/376 |

FOREIGN PATENT DOCUMENTS

| EP | 1 130 776 A2 | 9/2001 |
| EP | 1 229 646 A2 | 8/2002 |
| GB | 2 250 391 A | 8/1991 |
| GB | 2 250 391 A | 6/1992 |
| JP | 2001-111394 | 4/2001 |
| KR | 10 2002-0037441 | 5/2002 |

OTHER PUBLICATIONS

UK Office Action dated Dec. 15, 2004.
English Language Translation of Korean Notice dated Apr. 25, 2005.
Great Britain Office Action dated Nov. 16, 2005 for Application No. GB 0417373.8.

* cited by examiner

*Primary Examiner*—Timothy P. Callahan
*Assistant Examiner*—Cassandra Cox
(74) *Attorney, Agent, or Firm*—Harness, Dickey & Pierce (57) ABSTRACT

A device which may be configured to generate delayed clock signals by a specified phase difference, which may include a clock generator circuit for generating at least one clock signal, a delayed clock signal generator for delaying the at least one clock signal, a phase detect circuit for generating a selecting signal based on the amount of phase delay detected according to a half-cycle ($\pi$), and in comparison with the clock signal, a phase interpolation circuit for controlling the delay time of the delayed clock signals and interpolating the delayed clock signals, and a selecting circuit which outputs the delayed clock signal delayed by a specified phase difference.

21 Claims, 12 Drawing Sheets

DELAYED CLOCK SIGNAL GENERATOR

CROSS-REFERENCE TO RELATED APPLICATIONS

This U.S. nonprovisional patent application claims priority under 35 U.S.C. § 119 of Korean Patent Application 2003-53859 filed Aug. 4, 2003, the entire contents of which are hereby incorporated by reference.

BACKGROUND OF THE INVENTION

1. Field of the Invention

The present invention relates to the delaying of clock signals using delayed signal generators, which may detect, create or interpolate delayed clock signals. The delayed clock signals may include a delay in a clock signal cycle.

2. Description of the Related Art

Figure 8A:
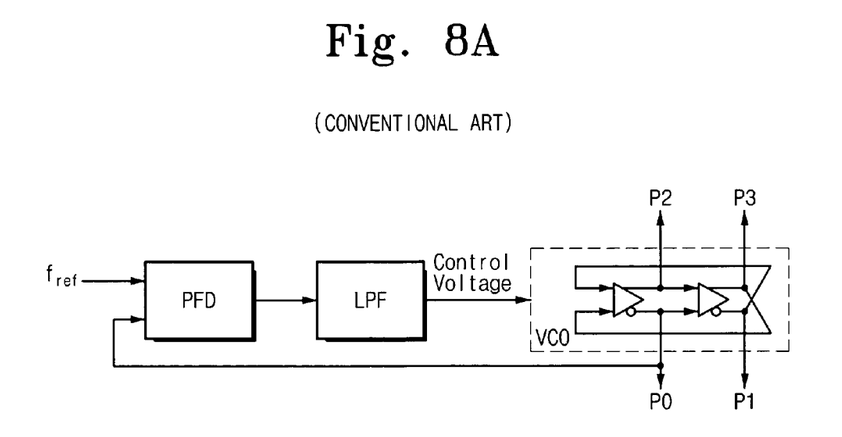
FIG. 8A illustrates a poly-phase clock signal generator utilizing a conventional PLL.
Figure 8B:
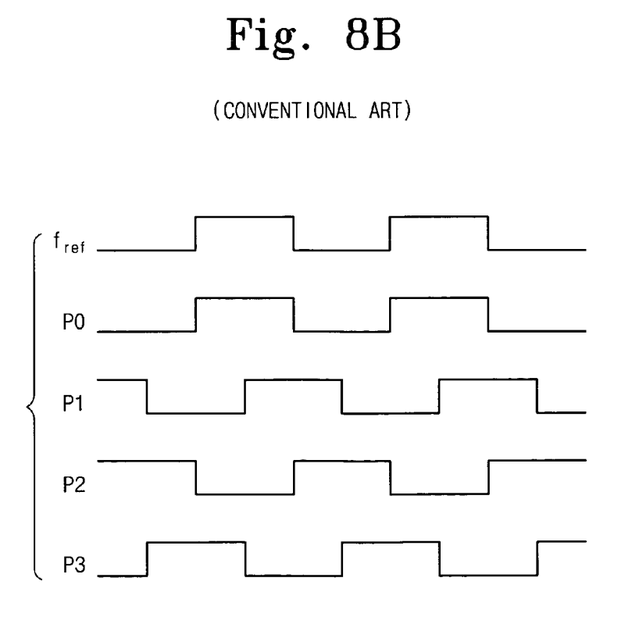
FIG. 8B illustrates a timing diagram of the input/output signals according to a FIG. 8A.

A poly-phase clock generator which utilizes a PLL (Phase Lock Loop) may extract signals from a VCO (Voltage Controlled Oscillator) that are phase locked by a phase of π/2, for example. FIG. 8A is a block diagram illustrating a conventional poly-phase clock generator utilizing a PLL. FIG. 8B is a timing diagram illustrating the input/output signals, which correspond to the input/output signals illustrated in the VCO of FIG. 8A. Referring to FIGS. 8A and 8B, if for example clock signal P0 is locked up with clock reference signal $f_{ref}$, the VCO may extract phases from P1, P2 and P3. FIG. 8B illustrates P0 having a phase cycle opposite from P0. P1 for example, may be delayed by a phase difference of π/2 compared to $f_{ref}$, and P3 may have a phase cycle opposite of P1.

A poly-phase clock generator utilizing a PLL may have certain advantages and disadvantages over a traditional PLL, depending upon the circuit configuration constructed to include the PLL. An advantage of using a poly-phase clock generator may include the removal of jitter. However, the poly-phase clock generator may have certain disadvantages. A first disadvantage may be the storage of unwanted jitter resulting from a closed loop configuration of the VCO. A second disadvantage of using a poly-phase clock signal generator may be the need for an analog circuit including a capacitor that uses a charge pump, and thus may not include a single integrated chip. In an attempt to compensate for the disadvantages that may be present when using a poly-phase clock generator, an increase in the dimensions, operation speed and power consumption of a corresponding circuit configuration may be required.

Another disadvantage that may be presented when using a poly-phase clock generator is the multiple clock cycles that may be required when attempting to lock onto a phase. Requests made for clock cycles to lock phase may require tens to hundreds of clock cycles before a phase is locked. Obtaining multiple clock cycles may require the clock signal generator change power levels promptly depending on the number of clock cycles required to lock phase.

A poly-phase clock signal generator may utilize a DLL (Delayed Locked Loop) instead of a PLL. The operation of the DLL may be similar to the PLL when used in a poly-phase clock signal generator, for example the DLL may include using a phase locked at 90 /2 similar to the PLL configuration, and a VCDL (Voltage Controlled Delay Line) which extracts poly-phase clock signals, as show in FIG. 9. Conversely, there may be differences between a poly-phase clock signal generator which utilizes a DLL instead of a PLL.

Figure 9:
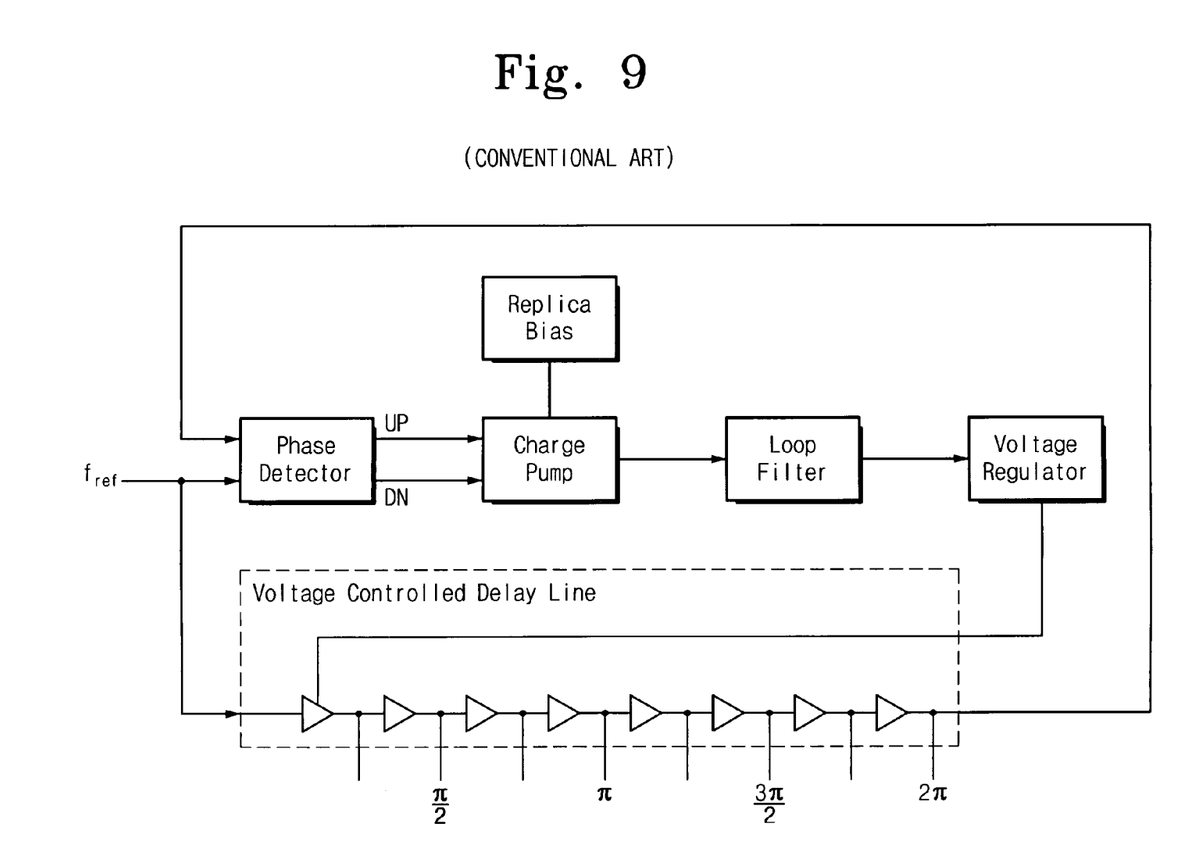
FIG. 9 illustrates a poly-phase clock signal generator utilizing a conventional DLL.

FIG. 9 is a block diagram illustrating a poly-phase clock signal generator employing a conventional DLL.

A VCDL may include a voltage regulator which delays a phase cycle output of the VCDL up to a phase of 90 /2, and may also extract signals from the output. As a result, if signals are extracted from a DLL, there may be certain advantages of a DLL when compared to a PLL which utilizes an analog circuit. For example, the DLL may use an open loop VCDL which is different from a closed loop VCO. The open loop VCDL may not have to store the phase error that a closed loop VCO would store, thus a more stable system may be obtained.

The clock generator that may be used in a digital DLL may have smaller dimensions, and thus may require less operation voltage than a PLL clock generator. However, a poly-phase clock signal generator which utilizes a DLL configuration may be subject to input jitter, and duty error associated with processing clock signals, and may require multiple clock cycles in order to lock a phase, similar to the PLL configuration.

SUMMARY OF THE INVENTION

Exemplary embodiments of the present invention may be directed to a delayed clock signal generator, which may provide delayed clock signals based on a specified delay interval.

An exemplary embodiment of the present invention may include a delayed clock signal generator or method for generating a delayed clock signal. The generator or method for generating a delayed clock signal may include a clock signal generator circuit for generating at least one clock signal, a delay signal generator circuit to receive the at least one clock signal and generate at least two phase delayed clock signals, a phase detect circuit for detecting phases which may correspond to the at least two phase delayed clock signals and generating at least one selecting signal, a phase interpolation circuit which interpolates the at least two phase delayed clock signals by using a specified ratio of internal division, to generate at least two phase interpolated clock signals, and a selecting circuit configured to provide at least one delayed clock signal based on at least one phase difference among at least one of the at least two phase interpolated clock signals, and the at least one selecting signal.

Exemplary embodiments of the present invention may further include a quantizer which may receive the phase delayed clock signals and generate corresponding quantized signals, and where the quantizer may include a flip-flop logic element.

Exemplary embodiments of the present invention may further include a detector configured to receive the quantized signals and sense a binary position for the quantized signals received, and detect a phase delay for phase delayed signals compared to a clock signal in order to generate a selecting signal. The detector may be capable of detecting an "H" at a position varied from ("0" to "1") or ("1" to "0"and/or an "L" at a rest position.

Exemplary embodiments of the present invention may further include the delay signal generator circuit containing delay elements, which may have the same or different delay times.

Exemplary embodiments of the present invention may further include a phase interpolation circuit which interpolates at least two phase delayed clock signals using a ratio of internal division of 1:1 for example, to generate the phase interpolated clock signals, and where the phase interpolation circuit may include interpolators which contain at least two inverters of unequal size, which may be configured to generate the at least one intermediate phase delayed clock signal.

Exemplary embodiments of the present invention may further include a delay element configured as a buffer containing two inverters.

Exemplary embodiments of the present invention may provide a clock signal, which is delayed by a specified amount of phase difference when compared to a clock signal that may have been generated by a clock signal generator.

BRIEF DESCRIPTION OF THE DRAWINGS

Exemplary embodiments of the present invention will become more apparent by describing in detail exemplary embodiments thereof with reference to the attached drawings in which.

DETAILED DESCRIPTION OF EXEMPLARY EMBODIMENTS OF THE INVENTION

Exemplary embodiments of the present invention will now be described more fully with reference to the accompanying drawings, in which exemplary embodiments of the present invention are shown. The present invention is not limited to the exemplary embodiments illustrated hereinafter. The exemplary embodiments herein are introduced to provide an understanding of the scope and spirit of the present invention.

Figure 1:
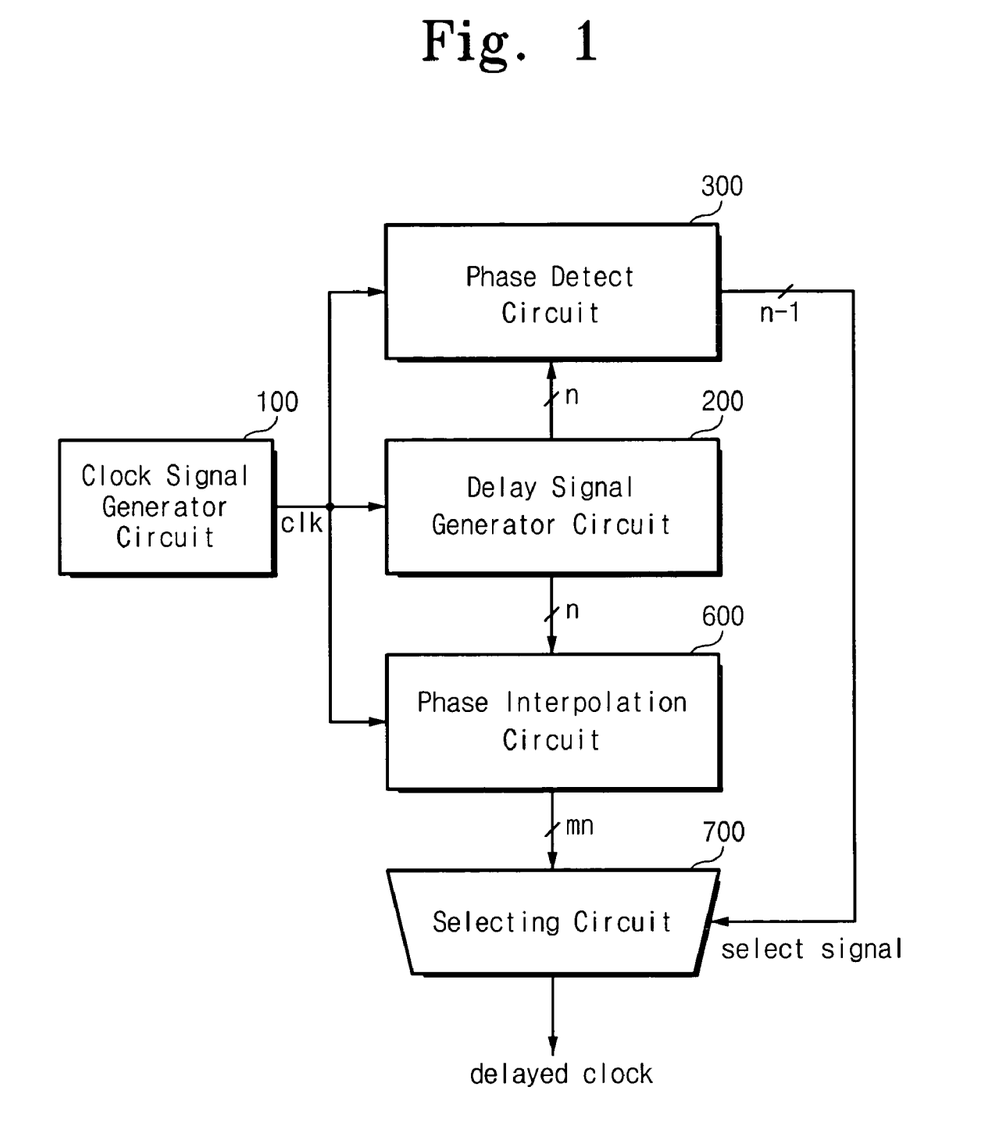
FIG. 1 is block diagram illustrating a delayed clock signal generator, according to an exemplary embodiment of the present invention.

FIG. 1 is a block diagram showing a generator of a delayed clock signal according to an exemplary embodiment of the present invention.

Referring to FIG. 1, the delayed clock signal generator may include a clock signal generator circuit 100, a delay signal generator circuit 200, a phase detect circuit 300, a phase interpolating circuit 600 and a selecting circuit 700. The clock signal generator circuit 100 may generate a clock signal (clk). The delay signal generator circuit 200 may generate a phase delayed clock signal. The phase detect circuit 300 may detect a phase delayed clock signal delayed as much as a half-cycle ($\pi$) for example, when compared with the clock signal (clk), and may generate a selecting signal based on the result of the comparison. The phase interpolating circuit 600 may interpolate two neighboring phase delayed clock signals by a specified ratio of internal division for example 1:1, to generate phase interpolated clock signals. The phase interpolated clock signals may have a corresponding phase of an intermediate value that is between the phases of the delayed signals that may be been interpolated. The selecting circuit 700 may output a clock signal delayed by a specified phase difference determined by comparing the phase delayed signal to the clock signal (clk), in response to a selecting signal.

Figure 2:
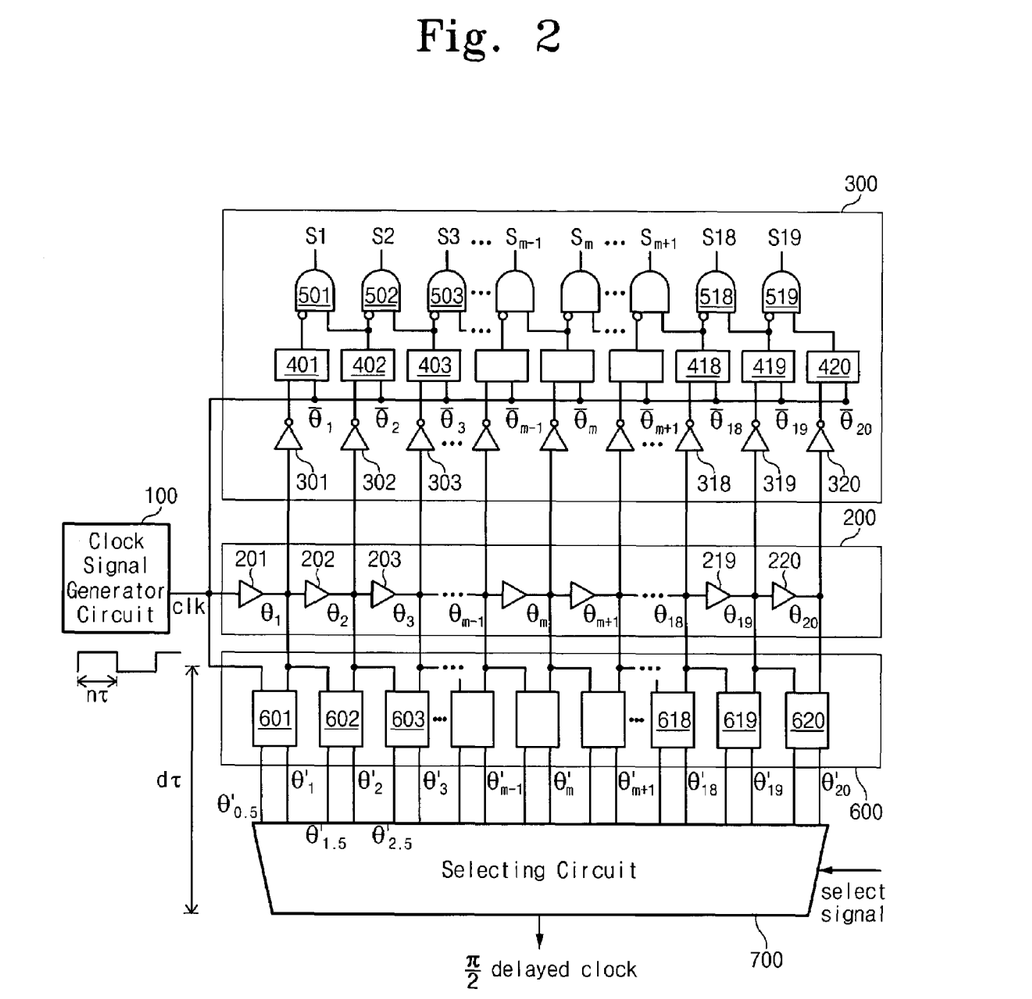
FIG. 2 illustrates a circuit diagram according to an exemplary embodiment of FIG. 1.

FIG. 2 is a circuit diagram illustrating the delayed clock signal generator, according to an exemplary embodiment of the present invention. The delayed clock signal generator may output a clock signal delayed as much as $\pi/2$ in comparison with the clock signal (clk).

Referring to FIG. 2, the delayed clock signal generator includes the clock signal generator circuit 100, the delay signal generator circuit 200, the phase detect circuit 300, the phase interpolating circuit 600 and the selecting circuit 700.

The clock signal generator circuit 100 sends a clock signal (clk) having a cycle of $2\pi$ for example, to the delay signal generator circuit 200, the phase detect circuit 300 and the phase interpolating circuit 600. Representing the clock signal cycle by $2n\tau$ for example, the clock signal would be a pulse signal having a half-cycle of $n\tau$ ($2n\tau/2$), where n may represent a number of delay elements, and $\tau$ may represent a delay time of a delay element.

The delay signal generator circuit 200 of FIG. 2 may contain a plurality of delay elements (201–220) connected in series, which may each have a delay time of $\tau$. A signal in an output terminal of an $m^{th}$ delay element may be delayed by $m\tau$ when compared to the clock signal (clk). Therefore, a delay signal for example $\theta n$, having a phase difference $n\tau$ when compared to the clock signal (clk) would be an output terminal of an $n^{th}$ delay element. In FIG. 2, the number of delay elements may not be limited to twenty (201–220), and may include more or less delay elements depending upon the design of the delayed clock signal generator and corresponding circuit configuration.

Figure 3A:
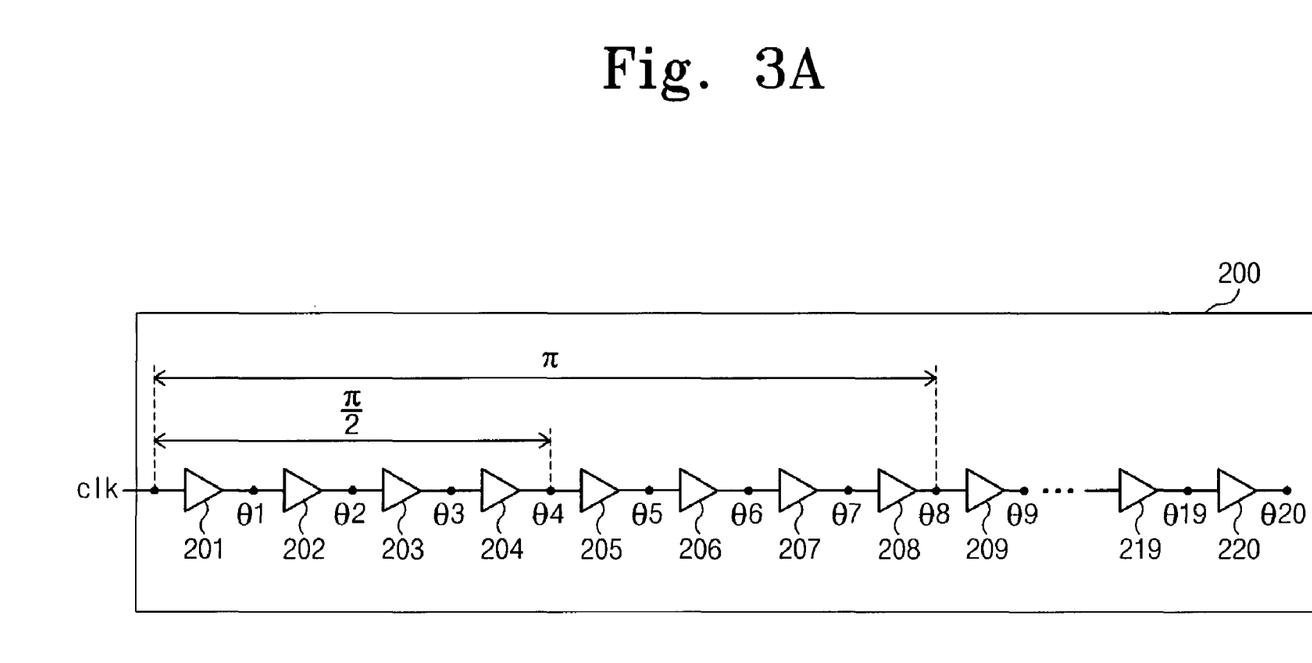
FIG. 3A illustrates an example circuit diagram according to a delay signal generator circuit of FIG. 2.
Figure 3B:
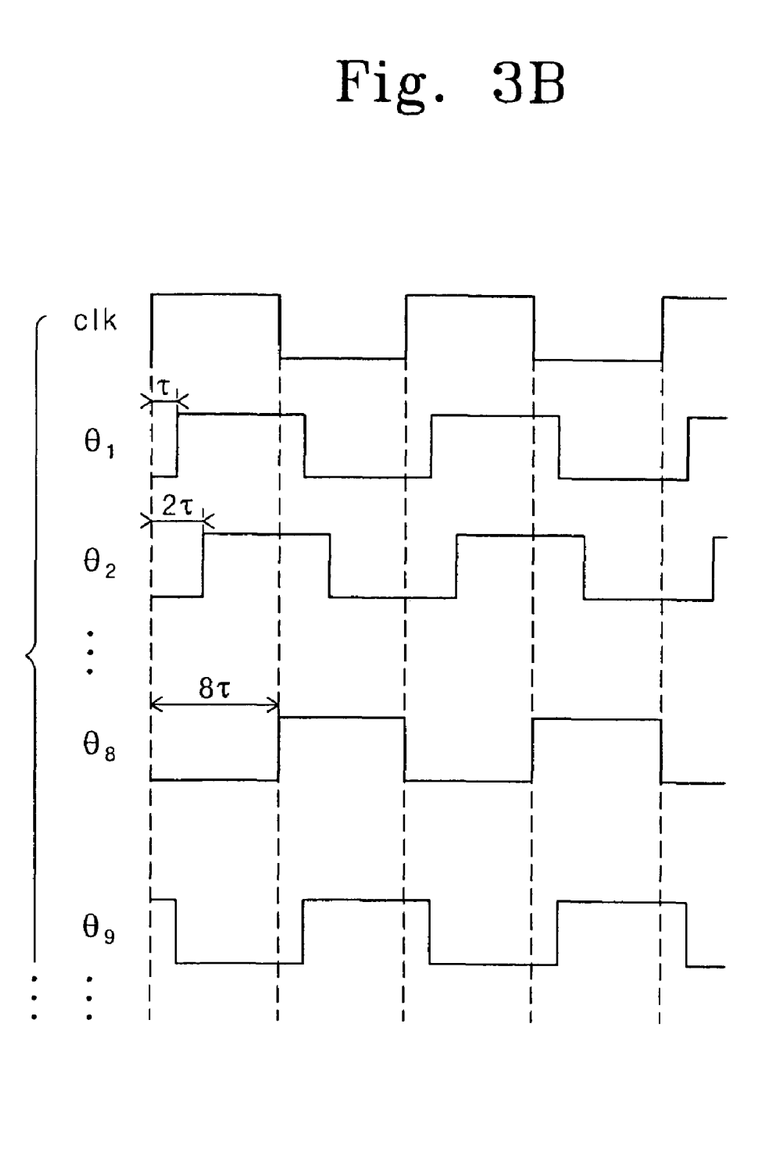
FIG. 3B illustrates an example timing diagram according to the delay signals of FIG. 3A.

FIG. 3A is an exemplary circuit diagram illustrating the delay signal generator circuit (200) of FIG. 2. FIG. 3A illustrates a half-cycle ($\pi$) of a clock signal $8\tau$, where n=8, and thus $n\tau=8\tau$. Signal $\theta 8$ which may be delayed by a half-cycle when compared to the clock signal (clk), may be generated in an output terminal of the delay element 208. Similarly, signal $\theta 4$ which may be delayed as much as $\pi/2$ when compared to the clock signal (clk) may be generated in an output terminal of the delay element 204. FIG. 3B is a timing diagram showing delay signals $\theta 1$, $\theta 2$, $\theta 8$ and $\theta 9$, which may be generated from the outputs of each corresponding delay elements 201, 202, 208 and 209, and represented by a phase difference corresponding the clock signal (clk).

Referring to FIG. 2, the clock signal (clk) generated from the clock signal generator circuit 100, and delay signals $\theta 1$–$\theta 20$ generated from the delay signal generator circuit 200 may be input to the phase detect circuit 300. The phase detect circuit 300 may include inverters 301–320, flip-flops 401–420 and gates 501–519, as illustrated in FIG. 2. The inverters 301–320 may reverse the output of the corresponding delay signals θ1–θ20. The flip-flops 401–420 may receive the clock signal (clk) and the reversed delay signals θ1–θ20, and perform quantization by converting the signals or a combination of the signals received into a "0" or "1". The gates 501–519 may receive the quantized signals and detect a phase θn. The phase detect circuit 300 may detect the phase θn and generate selecting signals s1–s19.

Figure 4A:
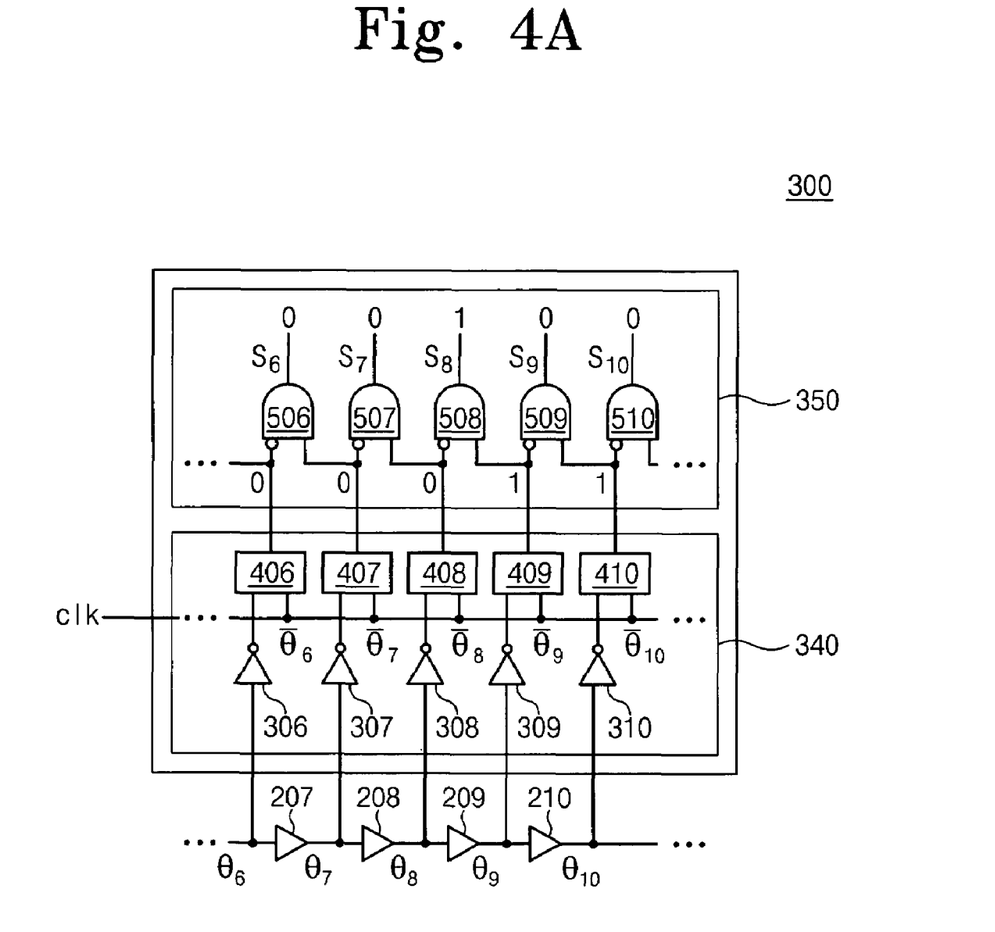
FIG. 4A illustrates a phase detect circuit according to an exemplary embodiment of FIG. 2.

FIG. 4A is a circuit diagram showing at least a portion of the phase detect circuit 300 of FIG. 2.

The phase detect circuit 300 may include a quantizer 340 and a detector 350. The quantizer 340 may receive the delay signals θ1–θ20 for example, and generate quantized signals based on a comparison operation of the signals received and the clock signal (clk). The detector 350 may detect a position that the quantized signals varied from "0" to "1".

Figure 4B:
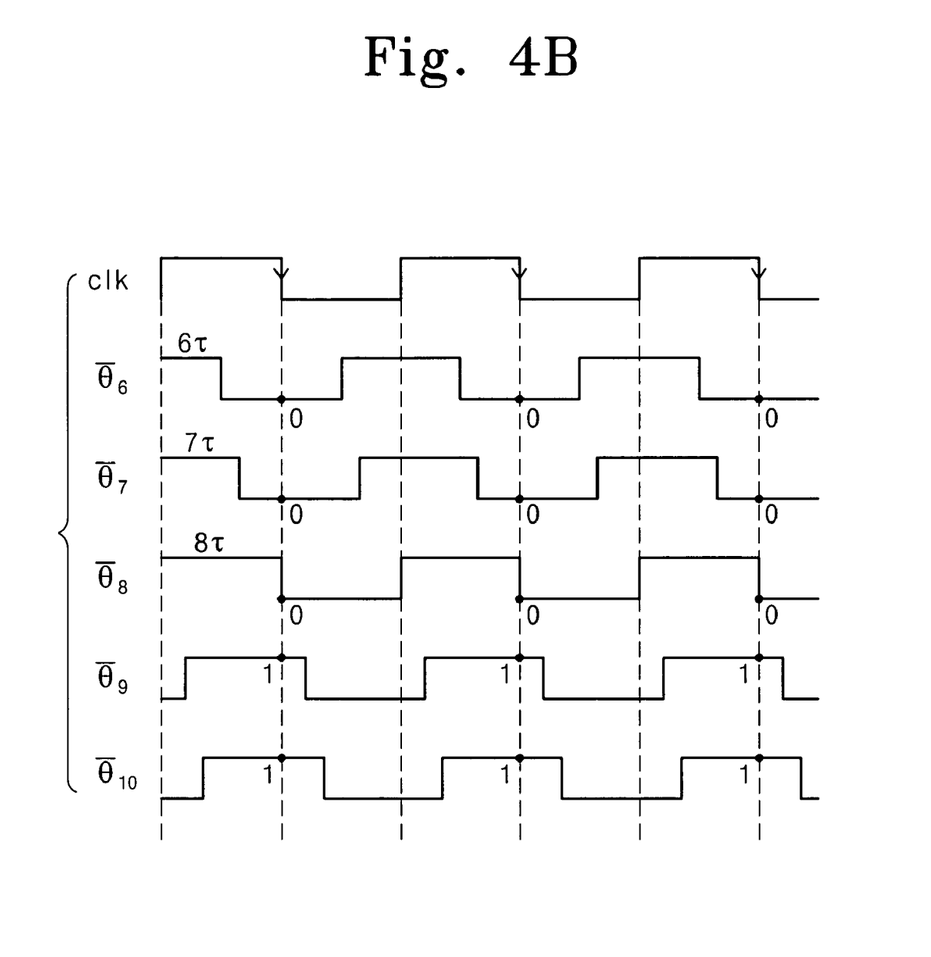
FIG. 4B illustrates an example timing diagram of inversed delay signals according to FIG. 4A.

Referring to FIG. 4A, if the delay signals θ6–θ10 for example, are input to the quantizer 340, the signals may be reversed by the corresponding inverters 306–310. Timing diagrams for the clock signal (clk) and the reversed signals θ6–θ10 is illustrated in FIG. 4B.

The clock signal (clk) and the reversed signals θ6–θ10 may be input to flip-flops 406–410, for example. The flip-flops may be operated at a negative edge of the clock signal. Referring to FIG. 4B, reversed signals θ6–θ8 for example, are quantized to an initial clock cycle interval of "0", and the reversed signals /θ9–/θ10 are quantized to an initial clock cycle interval of "1". Delay signals θ1–θ8 and θ17–θ20, which have a phase difference in the range of a half-cycle 8τ, when compared with the clock signal (clk), may be quantized to be "0", whereas the delay signals θ9–θ16, which have phase difference over a half-cycle 8τ, when compared with the clock signal (clk), may be quantized to be "1".

Referring to FIG. 4A, the detector 350 may include gates 506–510, which may be a combination of inverters and AND gates, for example. The quantized signals ("0" or "1") may be input to gates 506–510. The detector 350 may detect the position of a cycle interval varying from "0" to "1". A selecting signal s8 for example, output from gate 508 may become "1", and selecting signals s1–s7 and s9–s19 output from gates 501–507 and 509–520 may become "0". The selecting signals s1–s19 may be input to the selecting circuit 700.

Referring to FIG. 2, the clock signal (clk) which may be generated from the clock signal generator circuit 100 and delay signals θ1–θ20 which may be generated from the delay signal generator circuit 200, may be input to the phase interpolating circuit 600.

The phase interpolating circuit 600 may include a plurality of interpolators 601–620. The interpolators 601–620 may interpolate two neighboring phase delayed clock signals at a specified ratio of internal division (e.g., 1:1) and generate phase interpolating clock signals. The interpolator 601 may receive clock signal (clk) and delay signal θ1, and output delay signals (θ$_{0.5}$' and θ$_1$') which may be interpolated at a ratio of internal division of 1:1. Similarly, the m$^{th}$ interpolator may receive delay signals (θm−1 and θm) and output delay signals (θm-$_{0.5}$' and θ$_m$'). Delay signal θ$_{0.5}$' for example, may correspond to a delay signal and interpolating delay signals (θm−1 and θm) at a ratio of internal division of 1:1, thus delay signals may be more finely controlled.

Interpolators 601–620 may be used to generate a signal θ$_{n/2}$ for example, which may be delayed as much as π/2 provided that n of θn is an odd number. If for example n=7, a signal delayed as much as π/2 may occur between θ3 and θ4, and the interpolator may be used to generate a signal θ$_{3.5}$', which may correspond to the delayed signal between θ3 and θ4.

Figure 5A:
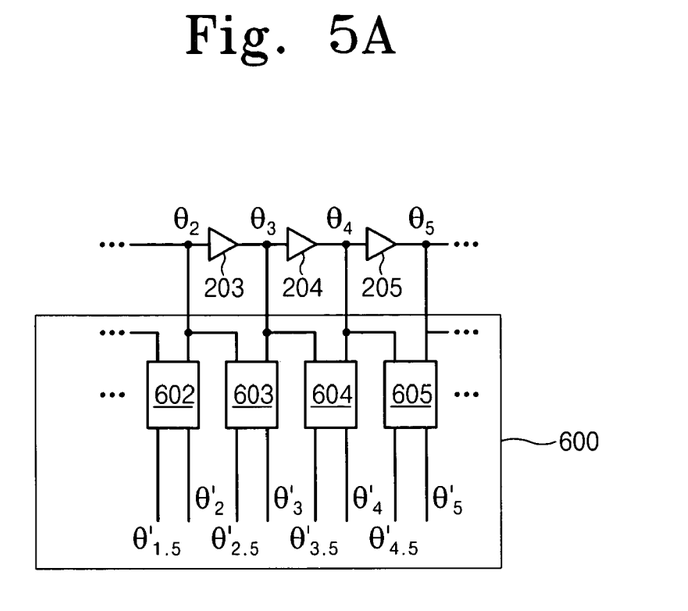
FIG. 5A illustrates a circuit diagram containing a phase interpolation circuit according to an exemplary embodiment of FIG. 2.

FIG. 5A is a circuit diagram illustrating a portion of the phase interpolating circuit 600, in accordance with an exemplary embodiment of the present invention. Referring to FIG. 5A interpolators 602–605 may be connected to both ends of delay elements 202–205 having a delay time τ. If for example, two neighboring delay signals (e.g., θ$_{3.5}$' and θ$_4$') are input to the interpolator 604, then delay signals (θ$_{0.5}$'~θ$_{20}$') with a phase difference of τ/2 may be output. Therefore, as many as forty delay signals (θ$_{0.5}$' and θ$_{20}$') in intervals of 0.5, may be output from the output terminal of the interpolators 601–620.

Figure 5B:
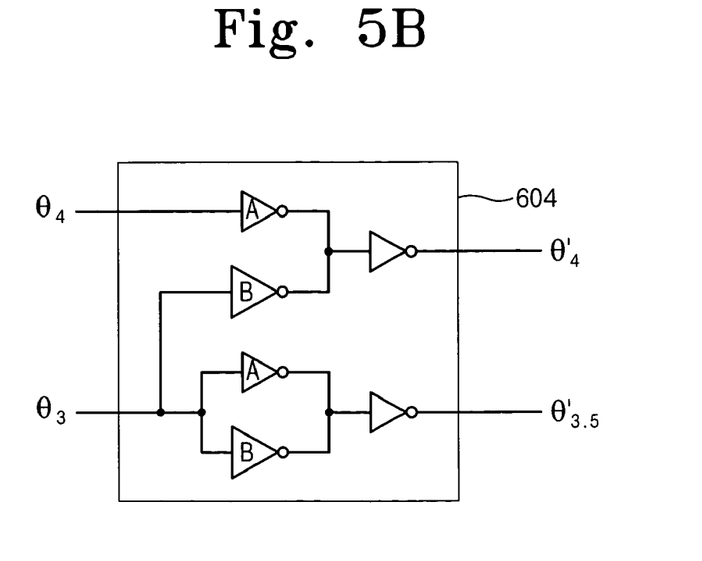
FIG. 5B illustrates a circuit diagram containing an interpolator according to an exemplary embodiment of FIG. 5A.

FIG. 5B is a circuit diagram illustrating an internal structure of interpolator 604, according to an exemplary embodiment of the present invention. Referring to FIG. 5B, the interpolator 604 may have inverters A and B of unequal size. A delay signal θ$_{3.5}$' for example, corresponding to a value between the two delay signals θ3 and θ4, may be obtained by controlling the size of the inverters A and B. If for example, inverter B is larger than inverter A then the delay time of inverter B may become short, which may result in θ$_{3.5}$' and θ$_4$' being generated. It should be understood by those skilled in the art that various options for controlling the size of an interpolator exist, and that interpolators are not limited to specific design characteristics.

Figure 5C:
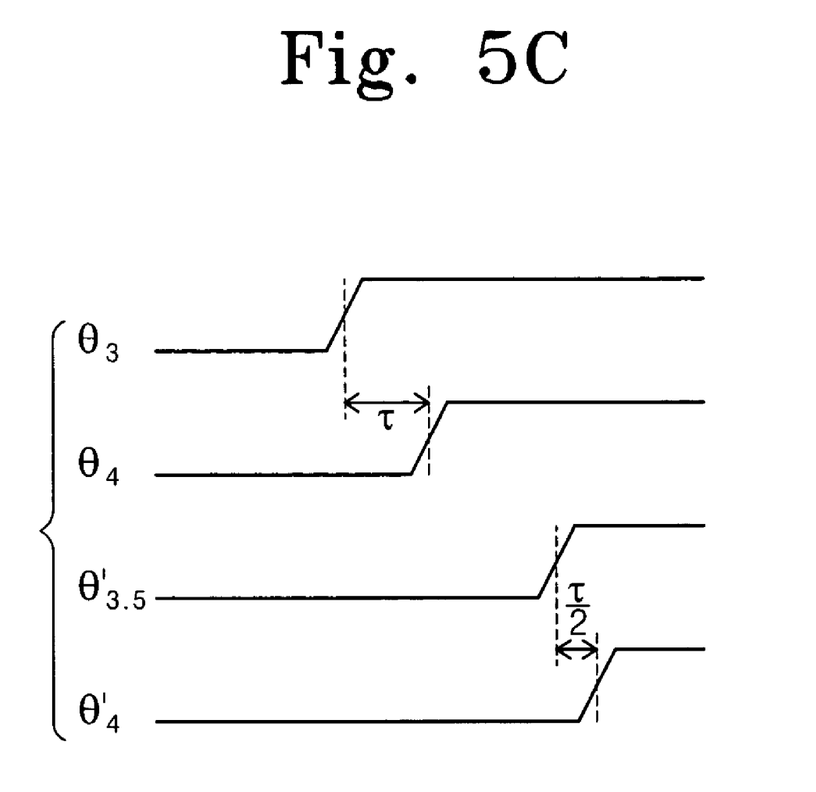
FIG. 5C illustrates a timing diagram for both ends of the interpolator according to an exemplary embodiment of FIG. 5B.

FIG. 5C is a timing diagram illustrating the corresponding input/output terminals of the interpolator 604 corresponding to FIG. 5B, and in accordance with an exemplary embodiment of the present invention.

Referring to FIG. 5C, delay signals θ3 and θ4 for example, may have a delay time of τ. The interpolator 604 may generate delay signals θ$_{3.5}$' and θ$_4$' for example, corresponding to output terminals of interpolator 604. A phase difference of the delay signals θ$_{3.5}$' and θ$_4$' represented by τ/2, may be recognized by altering the size of inverters A and B.

Referring to FIG. 2, delay signals θ$_{0.5}$'–θ$_{20}$' of the output terminals contained in the phase interpolating circuit 600, may be input to the selecting circuit 700. The selecting circuit 700 may be coded by selecting signals s1–s19 generated from the phase detect circuit 300. The delay signals θ$_{0.5}$'–θ$_{20}$' may be considered as the output of the interpolating circuit 600, and the delay signals may be delayed as much as π/2 when compared to the clock signal (clk).

Selecting signals s1–s19 may be coded by a delayed time ("a compensation time" or "dτ") via the phase interpolating circuit 600 and the selecting circuit 700. As a result of coding the selecting signals by a specified delayed time, a delayed clock signal may be generated, which may be compensated as much as dτ when the delay signal θ$_{n/2}$ is output. If for example, n=8 and d=3, then a phase delayed clock signal θ4 will be generated (for θ$_{n/2}$ where n=8/2, and for dτ=3τ) at the output terminal of delay element 204, as illustrated in an exemplary embodiment of FIG. 6. A signal delayed as much as π/2 when compared with the clock signal (clk) may be generated from the output of θ1.

Figure 6:
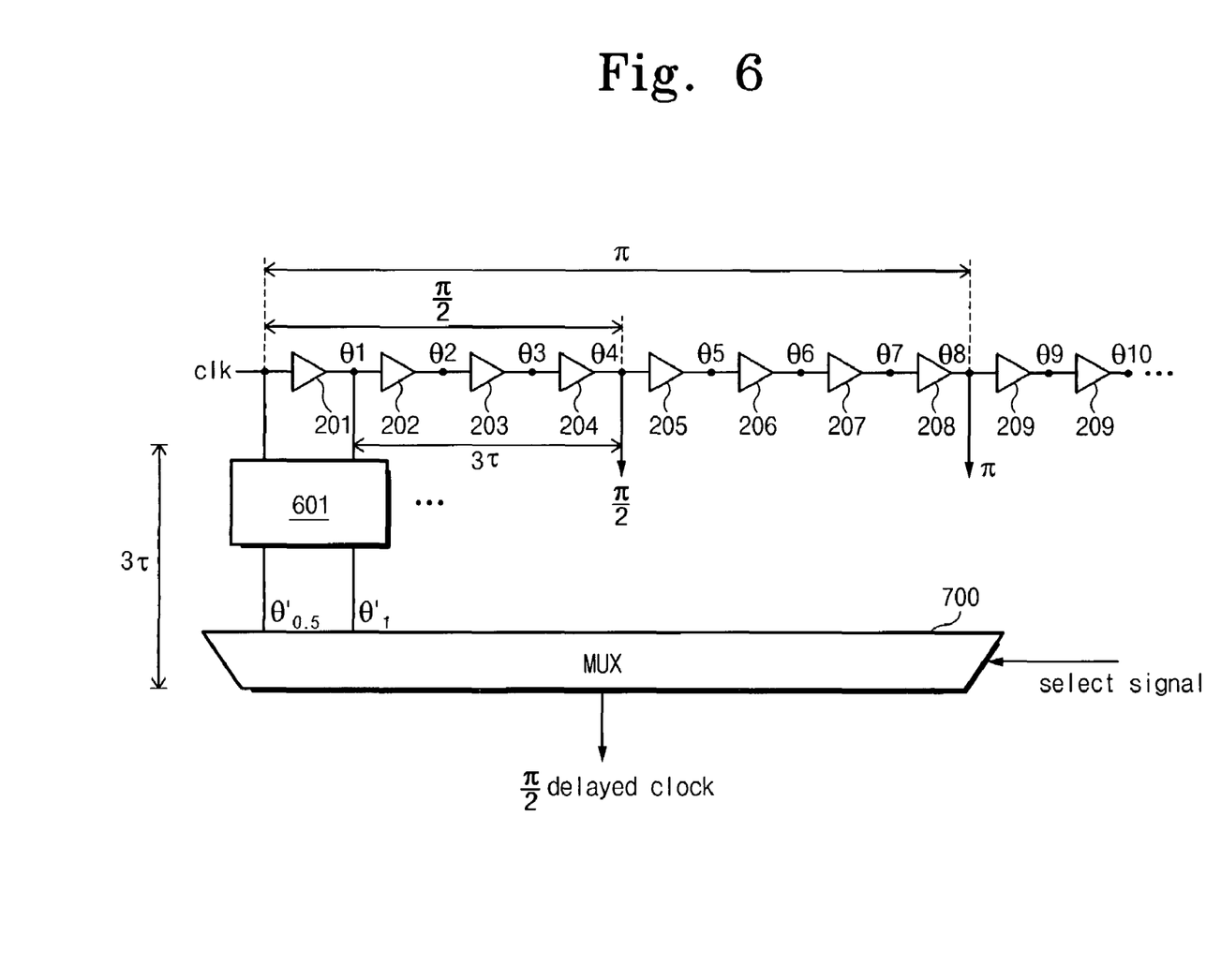
FIG. 6 is a circuit diagram illustrating compensation delay time according to an exemplary embodiment of the present invention.

FIG. 6 is a circuit diagram illustrating a compensation delay time according to an exemplary embodiment of the present invention.

Referring to FIG. 6, θ$_n$=θ8, and θ$_{n/2}$=θ4 for example, and the compensation delay time dτ=3τ, thus a signal delayed as much as π/2 when compared with the clock signal (clk) may be produced from θ1, for example delay signal θ$_1$'.

Assuming that θn is instead equal to θ7 for example, and θ$_{n/2}$ is a delay signal between θ3 and θ4, and the compensation delay time dτ=3τ, then a signal delayed as much as π/2 when compared with the clock signal (clk) may be delay signal θ$_{0.5}$' and may be the output of interpolator 601. Delay signal θ$_{0.5}$' may be selected by a corresponding selecting signal, for example selecting signal s7.

Figure 7:
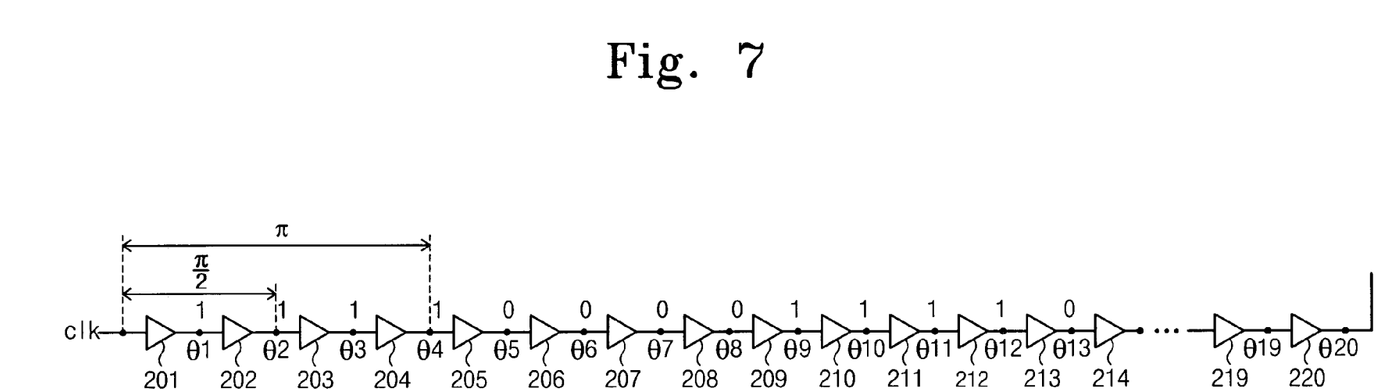
FIG. 7 is a circuit diagram illustrating the repetition of a delay signal according to an exemplary embodiment of the present invention.

FIG. 7 is a circuit diagram illustrating same signal repetition, according to an exemplary embodiment of the present invention.

Referring to FIG. 7, if for example "n" represents a small number relative to the number of delay elements in the delay signal generator, then the same delay signal may be repeated. An example of repeating a delay signal may include for example, when the number of delay elements is twenty, and θn=θ4 (n being the last element of a delay signal sequence) then the same delay signal at θ4 may be present at θ12, and the same delay signal at θ2 may be present at θ10, for example. If dτ=3τ for example, it may be not be possible that a signal delayed by 3τ may output the same signal as θ2, for example. A signal may be selected to have a same delay 3τ for example, as another signal. Two signals selected based on a delay interval of 3τ, which have the same delay may be θ7 and θ10, for example.

The delayed clock signal generator may sense a half-cycle of a clock signal and generate a clock signal delayed as much as π/2 or 3π/2 for example, when compared to the clock signal (clk) without requiring an external control signal or a feedback loop.

While the present invention has been particularly shown and described with reference to exemplary embodiments thereof, it will be understood by those of ordinary skill in the art that various changes in form and details may be therein without departing from the spirit and scope of the present invention as defined by the following claims.

What is claimed is:

1. A delayed clock signal generator comprising:
   a clock signal generator circuit for generating at least one clock signal;
   a delay signal generator circuit configured to receive the at least one clock signal and generate at least two phase delayed clock signals;
   a phase detect circuit configured to detect at least two phases corresponding to the at least two phase delayed clock signals, and generate at least one selecting signal;
   a phase interpolation circuit which interpolates at least two phase delayed clock signals by using a specified ratio of internal division, to generate at least two phase interpolated clock signals; and
   a selecting circuit configured to provide at least one delayed clock signal based on at least one of the at least two phase interpolated clock signals, and the at least one selecting signal.

2. The delayed clock signal generator of claim 1, wherein the delay signal generator circuit includes at least two delay elements.

3. The delayed clock signal generator of claim 2, wherein the delay elements have the same delay time.

4. The delayed clock signal generator of claim 1, wherein the phase detect circuit detects at least one delayed clock signal delayed as much as a half-cycle compared to the at least one clock signal generated, and generates the at least one selecting signal for selecting a phase delayed signal delayed as much as a quarter-cycle compared to the at least one clock signal generated by the phase interpolation circuit.

5. The delayed clock signal generator of claim 4, wherein the half-cycle and the quarter-cycle are denoted by π and π/2, respectively.

6. The delayed clock signal generator of claim 1, wherein the phase interpolation circuit interpolates the at least two phase delayed clock signals using a ratio of internal division of 1:1, and generates the at least two phase interpolated clock signals which correspond to at least one intermediate value of the least two phase delayed clock signals.

7. A delayed clock signal generator comprising:
   a clock signal generator circuit for generating at least one clock signal;
   a delay signal generator circuit including at least two delay elements and configured to receive the at least one clock signal, and generate at least two phase delayed clock signals having corresponding phases that are equal to the difference between the at least one clock signal and at least one output signal corresponding to at least one output terminal of the at least two delay elements;
   a phase detect circuit, which detects phases of the at least two phase delayed clock signals which is delayed as much as a half-cycle in comparison with the at least one clock signal, and generates at least one selecting signal;
   a phase interpolation circuit which interpolates the at least two phase delayed clock signals by using a specified ratio of internal division, and generates at least two phase interpolated clock signals; and
   a selecting circuit configured to provide at least one delayed clock signal based on at least one phase of at least one of the phase interpolated clock signals, and the at least one selecting signal.

8. The delayed clock signal generator of claim 7, wherein each of the at least two delay elements is a buffer including at least two inverters.

9. The delayed clock signal generator of claim 7, wherein the phase detect circuit comprises:
   a quantizer which receives the at least two phase delayed clock signals and generates at least two quantized signals; and
   a detector which receives the at least two quantized signals and detects the amount of delay for at least one said at least two quantized signals which is delayed by as much as a half-cycle (π) in comparison with the at least one clock signal, and generates at least one selecting signal corresponding to the amount of delay detected.

10. The delayed clock signal generator of claim 9, wherein the quantizer includes at least one flip-flop.

11. The delayed clock signal generator of claim 7, wherein the phase interpolation circuit interpolates at least two phase delayed clock signals at a ratio of internal division of 1:1, and generates at least two phase interpolated clock signals corresponding to an intermediate value of the at least two phase delayed clock signals.

12. The delayed clock signal generator of claim 7, wherein the selecting circuit outputs at least one delayed clock signal, delayed by as much as π/2 in comparison with the at least one clock signal.

13. A delayed clock signal generator which outputs at least one delayed clock signal delayed as much as a half quarter-cycle in comparison with at least one clock signal comprising:
   a clock signal generator circuit which generates the at least one clock signal;
   a delay signal generator circuit which receives the at least one clock signal and generates at least two phase delayed clock signals having corresponding phase differences compared to output terminals of corresponding delay elements;

a quantizer for receiving the phase delayed clock signals and generating at least two corresponding quantized signals;

a detector for receiving the at least two quantized signals and sensing a position of at least one of said at least two quantized signals varied from at least one of ("0" to "1) or ("1" or "0") for detecting at least two phase delayed signals, delayed as much as a half-cycle when compared with the at least one clock signal, and for generating at least one selecting signal corresponding to at least one of the at least two phase delayed signals;

a phase interpolation circuit for interpolating the at least two phase delayed clock signals by a specified ratio of internal division to generate at least two phase interpolated clock signals; and a selecting circuit which compensates at least one of said phase delayed clock signals by a first compensation time interval, and provides an output signal delayed as much as a quarter-cycle in comparison with the at least one clock signal, and in response to the at least one selecting signal, wherein the selecting circuit compensates the at least one phase delayed clock signal by a different compensation time interval if the compensation time becomes longer than the time required for generating the phase delayed clock signal, and provides an output signal in response to the at least one selecting signal, delayed as much as quarter-cycle in comparison with the at least one clock signal.

14. The delayed clock signal generator of claim 13, wherein the delay elements are buffers which include at least two inverters.

15. The delayed clock signal generator of claim 13, wherein the quantizer includes at least one flip-flop.

16. The delayed clock signal generator of claim 13, wherein the detector detects "H" at the position varied from ("0" to "1") or ("1" to "0"), and "L" at a rest position.

17. The delayed clock signal generator of claim 13, wherein the phase interpolation circuit interpolates the at least two signals at a ratio of internal division of 1:1, to generate the at least two phase interpolated clock signals which correspond to an intermediate value of the at least two phase delayed clock signals.

18. A delayed clock signal generator comprising:

a phase detect circuit including a quantizer which receives at least two phase delayed clock signals and generates at least two quantized signals, and a detector which receives the quantized signals and detects the amount of delay for at least one of said quantized signals, which is delayed by as much as a half-cycle in comparison with at least one clock signal, and generates at least one selecting signal corresponding to the amount of delay detected;

a phase interpolation circuit which receives and interpolates the at least two phase delayed clock signals using a specified ratio of internal division, and generates at least two phase interpolated clock signals; and a selecting circuit which receives the at least one selecting signal and at least one of said at least two phase delayed clock signals and provides a delayed clock signal based on a comparison between a specified phase of the at least one clock signal and the selecting signal.

19. A method for generating a delayed clock signal comprising:

receiving at least two phase delayed clock signals;

generating at least two quantized signals by reversing the at least two phase delayed signals with at least two corresponding inverters;

detecting a delay for at least one of said quantized signals;

generating at least one selecting signal corresponding to the amount of delay detected, wherein said at least one selecting signal represents at least one quantized value;

interpolating the at least two phase delayed clock signals using a specified ratio of internal division, and generating at least two phase interpolated clock signals; and receiving the at least one selecting signal and at least one of said at least two phase delayed clock signals and providing a delayed clock signal based on a comparison between a specified phase of the at least one clock signal and the selecting signal.

20. A phase detect circuit comprising:

a quantizer which receives at least two phase delayed clock signals and generates at least two quantized signals by reversing the at least two phase delayed signals with at least two corresponding inverters; and a detector which receives the quantized signals and detects delay for at least one of said quantized signals, and generates at least one selecting signal corresponding to the amount of delay detected, wherein said at least one selecting signal represents at least one quantized value.

21. A method for detecting phase comprising:

receiving at least two phase delayed clock signals;

generating at least two quantized signals by reversing the at least two phase delayed signals with at least two corresponding inverters;

detecting a delay for at least one of said quantized signals; and generating at least one selecting signal corresponding to the amount of delay detected, wherein said at least one selecting signal represents at least one quantized binary value.

* * * * *